United States Patent
Su et al.

(10) Patent No.: US 9,496,706 B2
(45) Date of Patent: Nov. 15, 2016

(54) FAST POWER SWING UNBLOCKING METHOD AND APPARATUS FOR DISTANCE PROTECTION IN POWER SYSTEM

(75) Inventors: Bin Su, Beijing (CN); Lei Jing, Beijing (CN); Qianjin Liu, Beijing (CN)

(73) Assignee: ABB RESEARCH LTD., Zurich (CH)

( * ) Notice: Subject to any disclaimer, the term of this patent is extended or adjusted under 35 U.S.C. 154(b) by 536 days.

(21) Appl. No.: 13/002,701

(22) PCT Filed: Jul. 7, 2008

(86) PCT No.: PCT/CN2008/071565
§ 371 (c)(1),
(2), (4) Date: Feb. 4, 2011

(87) PCT Pub. No.: WO2010/003282
PCT Pub. Date: Jan. 14, 2010

(65) Prior Publication Data
US 2011/0166720 A1    Jul. 7, 2011

(51) Int. Cl.
*G06F 19/00* (2011.01)
*H02H 3/40* (2006.01)
*G01R 31/08* (2006.01)

(52) U.S. Cl.
CPC ............ *H02H 3/40* (2013.01); *G01R 31/085* (2013.01); *G01R 31/088* (2013.01)

(58) Field of Classification Search
USPC ................ 700/286, 292, 296; 324/764.01
See application file for complete search history.

(56) References Cited

U.S. PATENT DOCUMENTS

| | | | | |
|---|---|---|---|---|
| 4,261,038 A | * | 4/1981 | Johns et al. | 700/293 |
| 5,448,167 A | * | 9/1995 | Takagi | 324/177 |

(Continued)

FOREIGN PATENT DOCUMENTS

| | | |
|---|---|---|
| CN | 1122962 A2 | 5/1996 |
| CN | 1472858 A1 | 2/2004 |

(Continued)

OTHER PUBLICATIONS

Karegar et al., A New Method for Fault Detection during Power Swing in Distance Protection 2009, Shahid Beheshti University, Ieee, p. 1-4.*

(Continued)

*Primary Examiner* — Kidest Bahta
(74) *Attorney, Agent, or Firm* — Robert A. Jefferis; Driggs, Hogg, Daugherty & Del Zoppo Co., LPA (57) ABSTRACT

The present invention discloses a fast power swing unblocking method and apparatus for a distance protection in a power system, which is able to ensure fast phase-segregated tripping of distance protection for faults during a power swing (3-phase or 2-phase swing). The power swing unblocking method in a power system according to the present invention comprises calculating changing rates of impedances for all operating loops of the distance protection in the power system; and determining a fault loop based on the calculated changing rates. If there is a fault loop, a blocked distance zone for the fault loop is unblocked. Before calculating the changing rates, whether the power system is under a power swing is checked and a distance zone that might mal-operate under the power swing is blocked if it is checked that the power system is under the power swing. By applying this invention, the performance of the distance protection during power swings can be improved, and the distance protection can ensure faster and phase-segregated operation, which are very beneficial for the system reliability.

16 Claims, 6 Drawing Sheets

(56) References Cited

U.S. PATENT DOCUMENTS

| | | | |
|---|---|---|---|
| 5,731,943 A * | 3/1998 | Roberts et al. | 361/80 |
| 2006/0152866 A1 | 7/2006 | Benmouyal et al. | |
| 2006/0197594 A1 * | 9/2006 | Scuderi | H03F 1/52 330/127 |

FOREIGN PATENT DOCUMENTS

| | | |
|---|---|---|
| CN | 101202441 A1 | 6/2008 |
| DE | 4100646 A1 | 9/1992 |
| EP | 0783197 A1 | 7/1997 |
| EP | 0994548 A2 | 4/2000 |

OTHER PUBLICATIONS

Demetrios Tziouvaras, Out-of Step Protection Fundamentals and Advancements, Schweitzer Engineering Laboratories, Inc. 30the Annual Western protective Relay Conference, Oct. 21-23, 2003, p. 1-27.*

Qing et al. A Fast Unblocking Scheme for Distance Protection to Identify Symmetrical Fault Occuring during Power Swings, 2006, College of Electric & electronic enginering Huazhong Universty of since and Technology, p. 1-8.*

Lin et al., A Novel Scheme to Identify Sysmmetrical Faults Occurring During Power Swings, Jan. 2008, Ieee, vol. 23, p. 73-78.*

IPEA/CN, International Preliminary Report on Patentability re Application No. PCT/CN2008/071565, Sep. 29, 2010, 5 pp.

ISA/CN, International Search Report re Application No. PCT/CN2008/071565, Apr. 9, 2009, 4 pp.

First Office Action issued Mar. 25, 2013 by Chinese Patent Office re Chinese application of ABB Research Ltd., No. 200880130701.X.

Extended European Search Report issued May 8, 2012 re European application of ABB Research Ltd., No. 08773120.4.

Response to ESSR filed May 8, 2012 by ABB Research Ltd. re European application No. 08773120.4.

First Office Action issued Feb. 27, 2012 by Russian Patent Office re Russian application of ABB Research Ltd, No. 2011104066.

* cited by examiner

FAST POWER SWING UNBLOCKING METHOD AND APPARATUS FOR DISTANCE PROTECTION IN POWER SYSTEM

RELATED APPLICATION

This application is a national filing of PCT application Serial No. PCT/CN2008/071565, filed Jul. 7, 2008.

FIELD OF THE INVENTION

The present invention generally relates to power system protection techniques, and more particularly, the present invention relates to a fast power swing unblocking method and apparatus for a distance protection in a power system.

BACKGROUND OF THE INVENTION

A power system or electrical network is said to be operating under steady-state conditions when there exists a balance between generated and consumed active power for the system. Power systems operating under steady-state conditions typically operate at or very near their nominal frequency.

Under certain circumstances, a power system can be disturbed such that it no longer operates under steady-state conditions. In that regard, power systems are subjected to a wide range of small or large disturbances during operating conditions. Small changes in loading conditions occur continually. The power system must adjust to these changing conditions and continue to operate satisfactorily and within the desired bounds of voltage and frequency.

A power swing condition can be the result of a disturbance that causes the power system to be removed from its steady state operating condition. Power system faults and their clearance, line switching, generator disconnection, and the loss or the application of large amounts of load are examples of system disturbances that can cause a power swing condition to occur in a power system. Upon the occurrence of a power swing condition, there exists an imbalance between generated and consumed active power for the system.

Depending on the severity of the system disturbance(s) and the actions of the power system controls during a power swing, the system may remain stable and return to a new equilibrium state, having experienced what is referred to as a stable power swing. However, severe power system disturbances can produce a large separation of system generator rotor angles, large swings of power flows, large fluctuations of voltages and currents, and eventually lead to a loss of synchronism between groups of system generators or between neighboring utility systems. This occurrence is referred to as an unstable power swing.

Power swings, whether stable or unstable, can cause undesirable results. In particular, power swings can cause the impedance presented to a distance protection to fall within the operating characteristics of the distance protection, away from the pre-existing steady-state load condition, and cause the distance protection to actuate an undesired tripping of a system transmission line. The undesired operation of the distance protections during a power swing can further aggravate the power system disturbance and cause system instability, major power outages and/or power blackouts. This can cause an otherwise stable power swing to become an unstable power swing. It will therefore be understood that distance protections preferably should not operate during stable power swings to allow the power system to establish a new equilibrium state and return to a stable condition.

During an unstable power swing, two or more areas of a power system, or two or more interconnected networks, lose synchronism, Uncontrolled tripping of circuit breakers during an unstable power swing condition could cause equipment damage and pose a safety concern for utility personnel. Therefore, it is imperative that the asynchronous system areas be separated from each other quickly and automatically in order to avoid extensive equipment damage and shutdown of major portions of the power system. During an unstable power swing condition, a controlled tripping of certain power system elements is necessary in order to prevent equipment damage, widespread power outages, and to minimize the effects of the disturbance.

In view of the above fact, if a fault occurs during a power swing, a distance protection performed by the distance protection should be able to operate reliably. The distance protection needs to detect the fault and select the fault phase quickly and reliably, under various power swing periods (for example, 0.1 s~5 s), power angles when the fault occurs, and operating conditions (3-phase swing or single-pole open power swing, i.e. 2-phase swing).

In the conventional distance protections, for an asymmetrical fault during a power swing, it is normally detected by the presence of negative sequence and zero sequence components. The Chinese patent application No. 90211534.0 has disclosed such a method that set the criteria as |I2|+|I0|>m|I1|, where I0, I2 and I1 represent the zero sequence current, negative sequence current and positive sequence current respectively, and m is a coefficient between 0.5 and 1. Some other manufactures set the above criteria as |I2|>m|I1|, |I0|>n|I2|, where n also is a coefficient. Such unblocking method has different delays for different power angle between the equivalent systems at both terminals. If the fault occurs when power angle is small, the delay will be very short. However, under certain unfavorable conditions, the delay might be more than 30% of the power swing period.

For a symmetrical fault during power swing, it is normally detected with low power swing centre voltage (u cos φ). When the power swing centre voltage stays close to zero for more than a given period, such as 150 ms, 500 ms, etc., the distance protection is unblocked.

There are also some improved schemes for faster unblocking. For example, the Chinese patent application No. 03146340.1 has disclosed a method of distinguishing line fault with power swing based on change rate of measured resistance, which utilizes changing rate of measured resistance to unblock the distance protection.

However, the common problem existing in the above mentioned methods is that their response speeds are slow, especially for slow power swings. The long delays of power swing unblocking will slow down the operation speed of a distance protection, thus are unfavorable for the system reliability and device safety.

SUMMARY OF THE INVENTION

In view of the above situation, the present invention has been made to provide a fast power swing unblocking method and apparatus for a distance protection in a power system, which is able to ensure fast phase-segregated tripping of distance protection for faults during a power swing (3-phase or 2-phase swing).

A typical distance protection has several zones with three phase to phase loops (A-B, B-C, C-A) for phase to phase faults and three phase to earth loops (A-G, B-G, C-G) for phase to earth fault for each of the independent zones. A, B and C indicate the three phases in a three phase power system, and G indicates the earth. During a 3-phase operating condition, all these 6 loops are operating loops, while during a single-pole open (2-phase) operating condition, only 3 loops (2 phase to earth loops and 1 phase to phase loop) comprised by the remaining 2 phases are operating loops. For example, when phase C is open, loop A-G, B-G, A-B are operating loops.

In one aspect of the present invention, there is provided a power swing unblocking method in a power system comprising calculating changing rates of impedances for all operating loops in the power system; and determining one or more fault loops based on the calculated changing rates.

In a preferred embodiment of the present invention, the power swing unblocking method further comprises a step of unblocking a blocked distance zone for the fault loop.

In a further preferred embodiment of the present invention, the power swing unblocking method further comprises, before calculating the changing rates, steps of checking whether the power system is under a power swing; and blocking a distance zone that might mal-operate under the power swing if it is checked that the power system is under the power swing.

The changing rate means the change of impedances (in terms of vectors, magnitudes, etc) during an intervening period.

In another embodiment of the present invention, the power swing unblocking method further comprises a step of measuring the impedances for all the operating loops in the power system; and the changing rates of the impedances for all the operating loops in the power system are respectively calculated according to the following formula:

$$D_y(x)=\text{abs}(Z_y(x)-Z_y(x-p))$$

where D is the changing rate, the subscript "y" represents the operating loop under measurement, Z is the measured impedance, x is the current measured sample point and p represents the number of sample points during an intervening period.

During a 3-phase power swing, if the changing rates of all the operating loops keep being smaller than those of predetermined period before for a set period respectively and the changing rates of all the operating loops are close to each other, a symmetrical fault is determined, whereas if the changing rate of one phase-ground loop keeps being smaller than those of the other two phase-ground loops for a set period, such a phase-ground loop is determined as the fault loop.

In addition, during a 3-phase power swing, if the changing rate of one phase-to-phase loop keeps being smaller than those of the other two phase-to-phase loops for a set period, such a phase-to-phase loop is determined as the fault loop.

For a 2-phase power swing, if the changing rates of all the 3 operating loops keep being smaller than those of predetermined period before for a set period respectively and the changing rates of all the operating loops are close to each other, a 2-phase-to-ground fault is determined, whereas if the changing rate of one operating loop keeps being smaller than those of the other two operating loops for a set period, such an operating loop is determined as the fault loop.

In a preferred embodiment of the present invention, the power swing unblocking method may determine the operating loop with the smallest changing rate as the fault loop.

In another aspect of the present invention, there is provided a power swing unblocking apparatus in a power system comprising a calculating means configured to calculate changing rates of impedances for all operating loops in the power system; and a determining means configured to determine one or more fault loops based on the changing rates calculated by the calculating means.

In a preferred embodiment of the present invention, the power swing unblocking apparatus further comprises an unblocking means configured to unblock a blocked distance zone for the fault loop.

In a further preferred embodiment of the present invention, the power swing unblocking apparatus further comprises a checking means configured to check whether the power system is under a power swing; and a blocking means configured to block one or more distance zones that might mal-operate under the power swing if it is checked by the checking means that the power system is under the power swing.

In another embodiment of the present invention, the power swing unblocking apparatus further comprises measuring means configured to measure the impedances for all the operating loops in the power system; and the changing rates of the impedances for all the operating loops in the power system are respectively calculated by the calculating means according to the following formula:

$$D_y(x)=\text{abs}(Z_y(x)-Z_y(x-p))$$

where D is the changing rate, the subscript "y" represents the operating loop under measurement, Z is the measured impedance, x is the current measured sample point and p represents the number of sample points during an intervening period.

The power swing unblocking apparatus according to the present invention may determine the operating loop with the smallest changing rate as the fault loop.

Furthermore, computer program for implementing the above-mentioned power swing unblocking method is also provided.

In addition, computer program products in at least one computer-readable medium comprising the program codes for implementing the above-mentioned power swing unblocking method are also provided.

The above and other objects and features will be detailed described in the following description. It should be noted that the following detailed descriptions are only used to sufficiently disclose the preferred embodiments of the present invention but not to limit the present invention.

BRIEF DESCRIPTION OF THE DRAWINGS

The above and other features and advantages of the present invention will become apparent from the following description when taken in conjunction with the accompanying drawings which illustrate preferred embodiments of the present invention by way of example. In the accompanying drawings, the same or corresponding technical features or components will be represented by the same or corresponding reference signs.

DETAILED DESCRIPTION OF THE EMBODIMENTS

Exemplary embodiments of the present invention will be described in conjunction with the accompanying drawings hereinafter. For the sake of clarity and conciseness, not all the features of actual implementations are described in the specification. However, it is to be appreciated that, during developing any of such actual implementations, numerous implementation-specific decisions must be made to achieve the developer's specific goals, for example, compliance with system-related and business-related constraints which will vary from one implementation to another. Moreover, it is also to be appreciated that, such a development effort might be very complex and time-consuming, but may nevertheless be a routine task for those skilled in the art having the benefit of this disclosure.

Figure 1A:
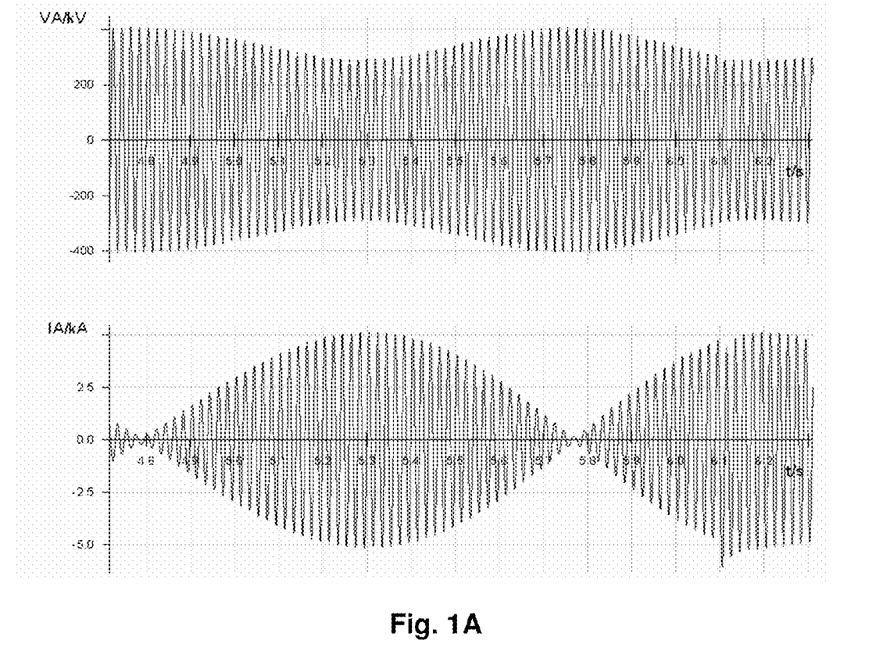
FIG. 1A shows the measured current and voltage of one phase during a power swing before and after a fault occurs in a power system.
Figure 1B:
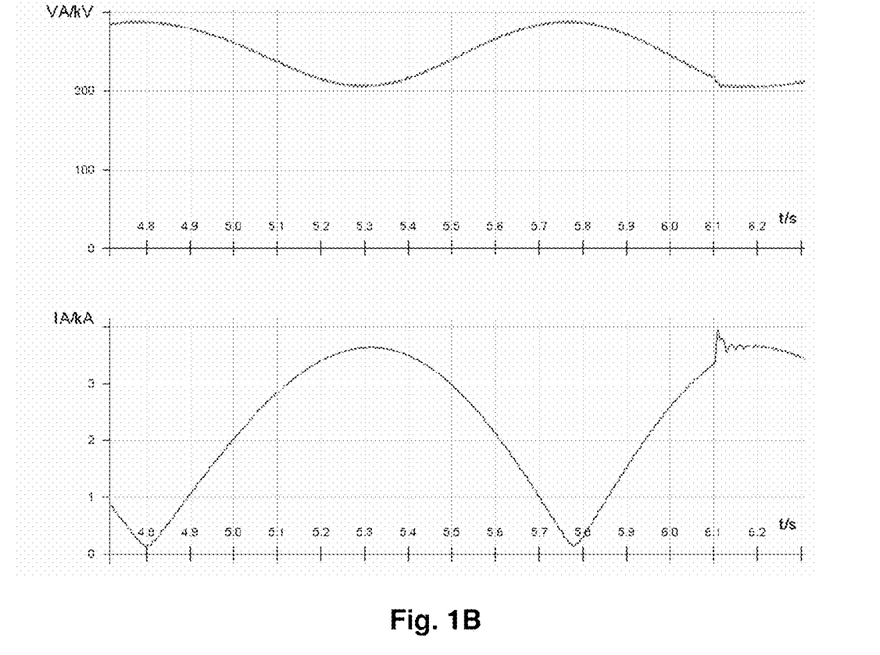
FIG. 1B shows the amplitude profiles of the measured current and voltage of one phase during a power swing before and after a fault occurs in a power system.
Figure 2:
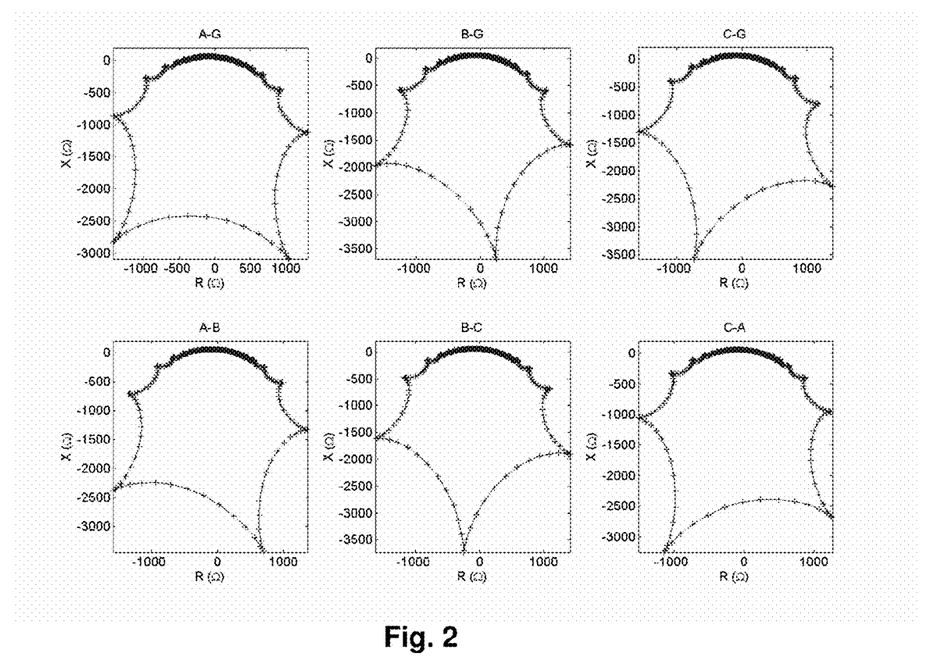
FIG. 2 shows the measured impedances during a pure power swing in a power system.
Figure 3:
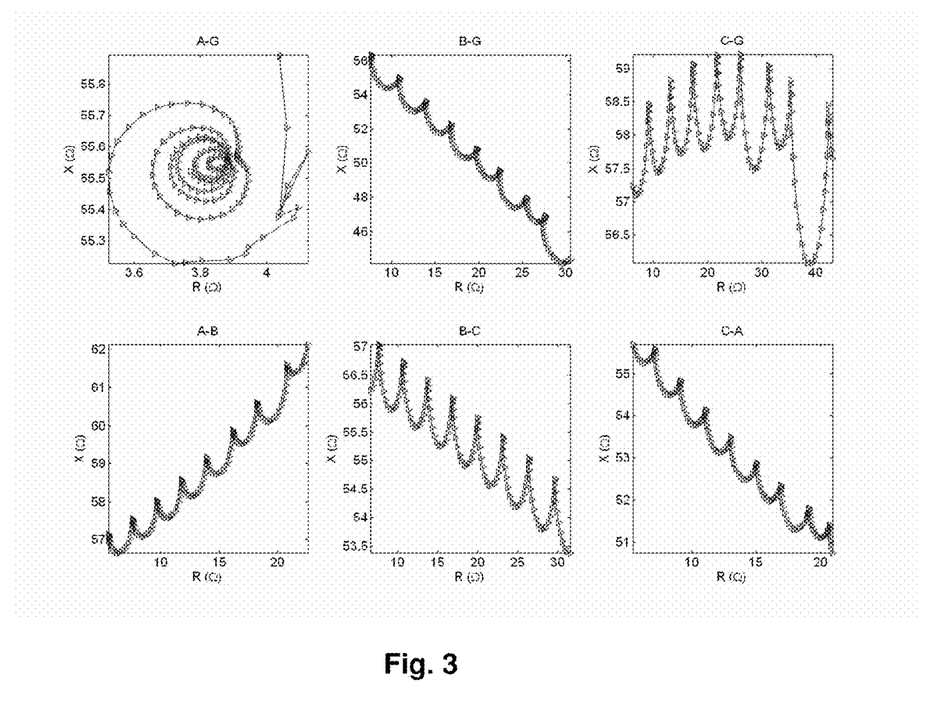
FIG. 3 shows the measured impedances from 20 ms after an A-G metallic fault to 100 ms after the A-G metallic fault during a power swing in a power system.

Firstly, let us study the change of the current, voltage and impedance during a power swing before and after a fault occurs in a power system. The measured currents and voltages, and the measured impedances during a power swing before and after a fault occurs in a power system are shown in FIG. 1A, FIG. 1B, FIG. 2 and FIG. 3 respectively. In this case, the power swing period is 1 second, and the fault is an A-G metallic fault that occurs at T=6.1 s. FIG. 1A shows the measured current and voltage of phase A during a power swing before and after a fault occurs in a power system and FIG. 1B shows the amplitude profiles of the measured current and voltage of phase A during a power swing before and after a fault occurs in a power system, while FIG. 2 shows the measured impedances during a pure power swing in a power system and FIG. 3 shows the measured impedances from 20 ms after an A-G metallic fault to 100 ms after the A-G metallic fault during a power swing in a power system.

It can be seen that during a power swing without any fault, the measured voltages and currents are changing remarkably and periodically, as shown in FIG. 1A and FIG. 1B. The measured impedances of all the operating loops (for a 3-phase swing, 6 loops, including A-G, B-G, C-G, A-B, B-C, C-A; for a 2-phase swing, 3 loops, e.g. for phase C open, loop A-G, B-G, A-B) swing in the impedance planes. In such a situation, the measured impedances can enter the operate characteristic of the distance protection and might cause mal-operation if no preventive measures have been taken.

In addition, the measured impedances of all the operating loops have similar loci, as shown in FIG. 2. Consequently, the changing rates of all the operating loops are approximately equal to each other, as shown in the following Table 1.

Here, the changing rate means the change of impedances (in terms of vectors, magnitudes, etc) during an intervening period. A favorable formula for calculating the changing rates of the impedances for all the operating loops in the power system can be expressed as follows:

$$D_y(x)=abs(Z_y(x)-Z_y(x-p))$$

where D is the changing rate, the subscript "y" represents the operating loop under measurement, Z is the measured impedance, x is the current measured sample point and p represents the number of sample points during an intervening period.

According to the exemplary example shown in the table 1 of one embodiment of the present invention, the changing rate is calculated by the absolute value of the deviation between the present measured impedances and those of 1 cycle before and the definition of the changing rate can be further expressed as:

$$D_y(x)=abs(Z_y(x)-Z_y(x-N)) \quad (1)$$

where D, "y", Z and x have the same meanings as above respectively, and N is the number of sample points per cycle instead of the p sample points during the intervening period. That is, the intervening period is taken as one cycle.

Take A-G loop as an example, the above definition of the changing rate can be concretely expressed as:

$$D_{A-G}(x)=abs(Z_{A-G}(x)-Z_{A-G}(x-N)) \quad (1a)$$

TABLE 1

Changing rates of the measured impedances during a power swing with no fault

| Time (ms) | A-G | B-G | C-G | A-B | B-C | C-A |
|---|---|---|---|---|---|---|
| 5105.00 | 8.45 | 8.36 | 8.46 | 8.39 | 8.40 | 8.49 |
| 5107.50 | 8.26 | 8.33 | 8.37 | 8.27 | 8.38 | 8.31 |
| 5110.00 | 8.20 | 8.29 | 8.17 | 8.26 | 8.24 | 8.15 |
| 5112.50 | 8.18 | 8.13 | 8.06 | 8.17 | 8.07 | 8.13 |
| 5115.00 | 8.04 | 7.97 | 8.06 | 7.99 | 8.01 | 8.08 |
| 5117.50 | 7.88 | 7.95 | 7.97 | 7.89 | 7.99 | 7.92 |
| 5120.00 | 7.83 | 7.90 | 7.80 | 7.88 | 7.86 | 7.78 |
| 5122.50 | 7.81 | 7.75 | 7.71 | 7.80 | 7.71 | 7.76 |
| 5125.00 | 7.70 | 7.62 | 7.70 | 7.64 | 7.65 | 7.72 |
| 5127.50 | 7.54 | 7.60 | 7.63 | 7.55 | 7.64 | 7.58 |
| 5130.00 | 7.50 | 7.56 | 7.48 | 7.55 | 7.53 | 7.46 |
| 5132.50 | 7.48 | 7.42 | 7.40 | 7.47 | 7.39 | 7.44 |
| 5135.00 | 7.38 | 7.31 | 7.39 | 7.33 | 7.34 | 7.41 |
| 5137.50 | 7.24 | 7.29 | 7.33 | 7.25 | 7.33 | 7.28 |
| 5140.00 | 7.20 | 7.26 | 7.20 | 7.25 | 7.24 | 7.18 |
| 5142.50 | 7.18 | 7.14 | 7.12 | 7.18 | 7.11 | 7.16 |
| 5145.00 | 7.09 | 7.03 | 7.11 | 7.04 | 7.06 | 7.12 |

On the other hand, however, after the fault occurs during the power swing, the measured impedances of the fault loop(s) stay in a very small range, while those of other operating loops change in much bigger range, as shown in FIG. 3.

In such a situation, for an asymmetrical fault during a 3-phase swing, the changing rates of measured impedances of the fault loop(s) are much smaller than those of the other operating loops, as shown in the following Tables 2-4. For a symmetrical fault during a 3-phase swing, the changing rates of measured impedances of all the operating loops are similar, and much smaller than those before the fault, as shown in the following Table 5.

TABLE 2

Changing rates of the measured impedances after an A-G metallic fault during the swing

| Time after fault incurrence (ms) | A-G | B-G | C-G | A-B | B-C | C-A |
|---|---|---|---|---|---|---|
| −20.00 | 7.97 | 8.03 | 7.96 | 8.02 | 8.00 | 7.93 |
| −17.50 | 7.95 | 7.89 | 7.87 | 7.94 | 7.86 | 7.91 |
| −15.00 | 7.84 | 7.77 | 7.86 | 7.79 | 7.81 | 7.87 |
| −12.50 | 7.71 | 7.76 | 7.79 | 7.71 | 7.80 | 7.74 |
| −10.00 | 7.66 | 7.72 | 7.65 | 7.70 | 7.70 | 7.64 |
| −7.50 | 7.65 | 7.59 | 7.58 | 7.64 | 7.56 | 7.62 |
| −5.00 | 7.55 | 7.49 | 7.57 | 7.51 | 7.52 | 7.58 |
| −2.50 | 7.44 | 7.48 | 7.50 | 7.44 | 7.51 | 7.47 |
| 0.00 | 7.40 | 7.45 | 7.37 | 7.43 | 7.42 | 7.37 |
| 2.50 | 8.61 | 6.75 | 7.50 | 8.10 | 7.30 | 7.33 |
| 5.00 | 15.13 | 5.05 | 7.72 | 10.69 | 7.27 | 9.17 |
| 7.50 | 21.91 | 7.09 | 6.88 | 13.37 | 7.26 | 12.29 |
| 10.00 | 24.61 | 9.76 | 5.45 | 14.22 | 7.18 | 13.82 |
| 12.50 | 24.76 | 10.34 | 4.32 | 14.13 | 7.08 | 13.96 |
| 15.00 | 27.63 | 10.26 | 5.03 | 15.51 | 7.05 | 14.73 |
| 17.50 | 32.39 | 11.23 | 6.54 | 17.69 | 7.04 | 16.30 |
| 20.00 | 34.27 | 11.99 | 7.14 | 18.40 | 6.97 | 17.07 |
| 22.50 | 32.87 | 12.03 | 6.65 | 17.64 | 6.88 | 16.96 |
| 25.00 | 25.80 | 12.19 | 3.81 | 14.49 | 6.86 | 14.87 |
| 27.50 | 16.80 | 10.51 | 2.60 | 10.24 | 6.85 | 10.84 |
| 30.00 | 14.35 | 7.77 | 5.92 | 9.04 | 6.79 | 8.40 |
| 32.50 | 13.67 | 6.08 | 7.10 | 9.03 | 6.72 | 8.22 |
| 35.00 | 9.15 | 6.40 | 7.39 | 6.95 | 6.69 | 7.33 |
| 37.50 | 3.03 | 6.64 | 9.42 | 4.57 | 6.69 | 5.30 |
| 40.00 | 0.35 | 6.26 | 11.02 | 4.76 | 6.63 | 3.98 |
| 42.50 | 0.20 | 6.10 | 11.02 | 4.89 | 6.57 | 3.91 |
| 45.00 | 0.14 | 5.85 | 10.82 | 4.86 | 6.55 | 3.95 |
| 47.50 | 0.15 | 5.79 | 10.20 | 4.92 | 6.55 | 4.05 |
| 50.00 | 0.14 | 5.87 | 9.56 | 4.87 | 6.50 | 4.15 |
| 52.50 | 0.14 | 6.11 | 9.32 | 4.74 | 6.45 | 4.19 |
| 55.00 | 0.11 | 6.28 | 9.42 | 4.60 | 6.43 | 4.17 |
| 57.50 | 0.10 | 6.34 | 9.51 | 4.55 | 6.43 | 4.11 |
| 60.00 | 0.09 | 6.30 | 9.51 | 4.56 | 6.39 | 4.06 |

TABLE 3

Changing rates of the measured impedances after a BC-G metallic fault during the swing

| Time after fault incurrence (ms) | A-G | B-G | C-G | A-B | B-C | C-A |
|---|---|---|---|---|---|---|
| −20.00 | 7.97 | 8.04 | 7.94 | 8.02 | 8.01 | 7.93 |
| −17.50 | 7.95 | 7.90 | 7.86 | 7.94 | 7.85 | 7.91 |
| −15.00 | 7.84 | 7.78 | 7.85 | 7.79 | 7.81 | 7.87 |
| −12.50 | 7.71 | 7.76 | 7.78 | 7.71 | 7.79 | 7.74 |
| −10.00 | 7.67 | 7.72 | 7.64 | 7.70 | 7.69 | 7.63 |
| −7.50 | 7.65 | 7.60 | 7.57 | 7.64 | 7.56 | 7.61 |
| −5.00 | 7.55 | 7.49 | 7.56 | 7.50 | 7.52 | 7.58 |
| −2.50 | 7.43 | 7.48 | 7.50 | 7.43 | 7.51 | 7.46 |
| 0.00 | 7.39 | 7.44 | 7.38 | 7.43 | 7.42 | 7.36 |
| 2.50 | 7.05 | 12.51 | 9.92 | 9.65 | 12.12 | 8.02 |
| 5.00 | 5.09 | 19.80 | 11.02 | 13.01 | 16.59 | 8.01 |
| 7.50 | 2.44 | 21.94 | 14.02 | 13.77 | 16.74 | 9.00 |
| 10.00 | 2.91 | 21.89 | 21.01 | 14.03 | 20.09 | 12.78 |
| 12.50 | 3.84 | 26.64 | 25.59 | 16.41 | 26.77 | 16.07 |
| 15.00 | 3.39 | 32.32 | 26.30 | 18.69 | 29.92 | 16.76 |
| 17.50 | 3.57 | 33.43 | 27.80 | 19.11 | 29.83 | 17.16 |
| 20.00 | 4.48 | 33.53 | 32.31 | 19.49 | 32.44 | 20.33 |
| 22.50 | 5.07 | 28.28 | 31.16 | 16.74 | 28.69 | 19.69 |
| 25.00 | 6.46 | 20.80 | 30.29 | 12.68 | 26.06 | 19.28 |
| 27.50 | 7.26 | 20.89 | 25.41 | 12.13 | 25.21 | 17.75 |
| 30.00 | 7.10 | 18.53 | 16.84 | 11.16 | 18.70 | 12.90 |
| 32.50 | 6.47 | 10.73 | 12.81 | 7.88 | 10.85 | 9.71 |
| 35.00 | 6.91 | 5.16 | 12.31 | 4.68 | 9.92 | 10.56 |
| 37.50 | 8.14 | 6.10 | 8.29 | 4.11 | 8.45 | 9.16 |
| 40.00 | 8.62 | 2.34 | 1.87 | 3.92 | 2.42 | 5.87 |
| 42.50 | 8.47 | 0.16 | 0.26 | 3.74 | 0.09 | 5.85 |
| 45.00 | 8.10 | 0.18 | 0.14 | 3.80 | 0.05 | 5.67 |
| 47.50 | 7.77 | 0.14 | 0.12 | 3.81 | 0.00 | 5.64 |
| 50.00 | 7.65 | 0.12 | 0.11 | 3.83 | 0.01 | 5.63 |

TABLE 3-continued

Changing rates of the measured impedances after a BC-G metallic fault during the swing

| Time after fault incurrence (ms) | A-G | B-G | C-G | A-B | B-C | C-A |
|---|---|---|---|---|---|---|
| 52.50 | 7.72 | 0.10 | 0.10 | 3.83 | 0.00 | 5.60 |
| 55.00 | 7.87 | 0.09 | 0.10 | 3.84 | 0.01 | 5.48 |
| 57.50 | 7.95 | 0.09 | 0.09 | 3.85 | 0.00 | 5.34 |
| 60.00 | 7.99 | 0.08 | 0.08 | 3.86 | 0.00 | 5.30 |

TABLE 4

Changing rates of the measured impedances after a C-A metallic fault during the swing

| Time after fault incurrence (ms) | A-G | B-G | C-G | A-B | B-C | C-A |
|---|---|---|---|---|---|---|
| −20.00 | 7.96 | 8.03 | 7.96 | 8.01 | 8.01 | 7.93 |
| −17.50 | 7.94 | 7.90 | 7.86 | 7.94 | 7.86 | 7.91 |
| −15.00 | 7.84 | 7.78 | 7.85 | 7.79 | 7.81 | 7.87 |
| −12.50 | 7.71 | 7.76 | 7.77 | 7.71 | 7.79 | 7.74 |
| −10.00 | 7.67 | 7.72 | 7.64 | 7.71 | 7.69 | 7.64 |
| −7.50 | 7.66 | 7.59 | 7.56 | 7.64 | 7.56 | 7.62 |
| −5.00 | 7.57 | 7.49 | 7.56 | 7.51 | 7.52 | 7.58 |
| −2.50 | 7.43 | 7.47 | 7.51 | 7.44 | 7.51 | 7.46 |
| 0.00 | 7.40 | 7.45 | 7.37 | 7.43 | 7.42 | 7.36 |
| 2.50 | 7.30 | 7.33 | 7.75 | 7.17 | 7.62 | 7.59 |
| 5.00 | 10.26 | 7.24 | 8.47 | 9.04 | 6.93 | 9.98 |
| 7.50 | 17.08 | 7.22 | 14.59 | 12.69 | 9.59 | 17.47 |
| 10.00 | 22.59 | 7.20 | 20.03 | 15.25 | 13.48 | 23.43 |
| 12.50 | 24.06 | 7.10 | 21.71 | 15.45 | 15.04 | 25.11 |
| 15.00 | 24.36 | 7.03 | 21.99 | 15.44 | 15.15 | 25.48 |
| 17.50 | 28.81 | 7.02 | 24.15 | 18.02 | 16.12 | 29.07 |
| 20.00 | 33.70 | 7.00 | 26.81 | 20.47 | 17.52 | 33.22 |
| 22.50 | 33.99 | 6.91 | 27.01 | 20.52 | 17.43 | 33.65 |
| 25.00 | 31.11 | 6.84 | 25.64 | 18.75 | 17.32 | 30.97 |
| 27.50 | 22.48 | 6.83 | 19.22 | 13.17 | 14.54 | 22.31 |
| 30.00 | 14.40 | 6.80 | 11.68 | 8.02 | 9.83 | 14.18 |
| 32.50 | 13.61 | 6.74 | 9.42 | 8.81 | 7.04 | 12.98 |
| 35.00 | 11.97 | 6.67 | 8.99 | 8.63 | 6.91 | 11.56 |
| 37.50 | 5.49 | 6.67 | 6.42 | 5.88 | 6.32 | 6.51 |
| 40.00 | 2.90 | 6.64 | 3.18 | 6.80 | 4.87 | 1.04 |
| 42.50 | 4.03 | 6.58 | 2.41 | 7.45 | 4.40 | 0.06 |
| 45.00 | 3.92 | 6.53 | 2.40 | 7.38 | 4.37 | 0.02 |
| 47.50 | 3.94 | 6.52 | 2.39 | 7.40 | 4.35 | 0.00 |
| 50.00 | 3.88 | 6.52 | 2.42 | 7.26 | 4.40 | 0.00 |
| 52.50 | 3.78 | 6.46 | 2.50 | 6.96 | 4.49 | 0.00 |
| 55.00 | 3.71 | 6.42 | 2.56 | 6.74 | 4.57 | 0.00 |
| 57.50 | 3.71 | 6.41 | 2.57 | 6.70 | 4.59 | 0.00 |
| 60.00 | 3.67 | 6.40 | 2.55 | 6.69 | 4.57 | 0.00 |

TABLE 5

Changing rates of the measured impedances after an ABC metallic fault during the swing

| Time after fault incurrence (ms) | A-G | B-G | C-G | A-B | B-C | C-A |
|---|---|---|---|---|---|---|
| −20.00 | 7.96 | 8.03 | 7.95 | 8.01 | 8.00 | 7.93 |
| −17.50 | 7.95 | 7.88 | 7.86 | 7.94 | 7.85 | 7.91 |
| −15.00 | 7.83 | 7.78 | 7.86 | 7.79 | 7.81 | 7.87 |
| −12.50 | 7.71 | 7.75 | 7.78 | 7.71 | 7.79 | 7.74 |
| −10.00 | 7.66 | 7.72 | 7.63 | 7.70 | 7.69 | 7.63 |
| −7.50 | 7.65 | 7.60 | 7.56 | 7.63 | 7.56 | 7.61 |
| −5.00 | 7.55 | 7.50 | 7.55 | 7.51 | 7.52 | 7.58 |
| −2.50 | 7.43 | 7.48 | 7.49 | 7.44 | 7.51 | 7.46 |
| 0.00 | 7.39 | 7.45 | 7.38 | 7.43 | 7.42 | 7.37 |
| 2.50 | 8.45 | 12.51 | 9.80 | 10.93 | 12.12 | 7.59 |
| 5.00 | 15.14 | 19.98 | 10.44 | 19.11 | 16.59 | 9.98 |
| 7.50 | 22.21 | 22.52 | 13.28 | 24.30 | 16.74 | 17.46 |
| 10.00 | 25.27 | 22.75 | 20.77 | 25.13 | 20.09 | 23.44 |
| 12.50 | 25.44 | 26.99 | 25.74 | 26.28 | 26.78 | 25.12 |

TABLE 5-continued

Changing rates of the measured impedances
after an ABC metallic fault during the swing

| Time after fault incurrence (ms) | A-G | B-G | C-G | A-B | B-C | C-A |
|---|---|---|---|---|---|---|
| 15.00 | 27.81 | 32.21 | 26.39 | 31.00 | 29.92 | 25.49 |
| 17.50 | 32.42 | 33.41 | 27.59 | 34.54 | 29.83 | 29.07 |
| 20.00 | 34.44 | 33.72 | 32.21 | 34.70 | 32.45 | 33.22 |
| 22.50 | 33.29 | 28.43 | 31.44 | 30.81 | 28.69 | 33.65 |
| 25.00 | 26.25 | 20.26 | 31.10 | 20.67 | 26.06 | 30.97 |
| 27.50 | 16.61 | 19.77 | 26.27 | 14.95 | 25.21 | 22.31 |
| 30.00 | 13.10 | 17.58 | 17.02 | 14.84 | 18.70 | 14.18 |
| 32.50 | 12.69 | 10.49 | 12.23 | 11.58 | 10.84 | 12.98 |
| 35.00 | 8.83 | 5.42 | 12.16 | 4.97 | 9.92 | 11.55 |
| 37.50 | 3.08 | 5.92 | 8.49 | 1.74 | 8.45 | 6.51 |
| 40.00 | 0.17 | 2.19 | 1.98 | 1.36 | 2.41 | 1.04 |
| 42.50 | 0.01 | 0.08 | 0.09 | 0.04 | 0.10 | 0.06 |
| 45.00 | 0.01 | 0.04 | 0.03 | 0.03 | 0.04 | 0.01 |
| 47.50 | 0.00 | 0.01 | 0.00 | 0.01 | 0.01 | 0.00 |
| 50.00 | 0.00 | 0.01 | 0.00 | 0.00 | 0.00 | 0.00 |
| 52.50 | 0.00 | 0.01 | 0.00 | 0.00 | 0.00 | 0.00 |
| 55.00 | 0.00 | 0.01 | 0.00 | 0.00 | 0.01 | 0.00 |
| 57.50 | 0.00 | 0.00 | 0.01 | 0.00 | 0.01 | 0.00 |
| 60.00 | 0.01 | 0.01 | 0.00 | 0.00 | 0.00 | 0.00 |

In addition, overall simulations show that during a 2-phase swing, for a single-phase-to-ground fault or phase-to-phase fault, the changing rates of measured impedances of the fault loop(s) are much smaller than those of the other operating loops, while for a double-phase-to-ground fault, the changing rates of measured impedances of all the operating loops are similar, and much smaller than those before the fault.

Further study shows that the above phenomena are also available for arcing faults (at lease 20Ω phase-ground resistance, 5Ω phase-phase resistance).

According to the above phenomena, it is obvious that based on the changing rates of the measured impedances, faults during a power swing can be detected and the fault loop(s) can be determined reliably. The criterions for selecting the fault loops with respect to different situations are described in detail as follows.

1) Criterion for Asymmetrical Fault During 3-Phase Swing (Asym-3ph Criterion)

During a 3-phase swing, if the changing rates of one phase-ground loop keep being much smaller than those of the other two phase-ground loops for a set period (e.g. 1 cycle, 1.5 cycles, etc., the length of this period may be an internal setting or customer settable parameter), this loop is selected as the fault loop. Take A-G loop as an example, the operating criterion is:

$$D_{A-G}(x) < k_1 \cdot \min(D_{B-G}(x), D_{C-G}(x)) \quad (2)$$

where $k_1$ may be an internal setting or customer settable parameter, and the function 'min' is to get the minimum element from its parameters.

Similar criteria are presented for phase-to-phase faults and double-phase-to-ground faults during a 3-phase swing. If the changing rates of one phase-phase loop keep being much smaller than those of the other two phase-phase loops for a set period (e.g. 1 cycle, 1.5 cycles, etc., the length of this period may be an internal setting or customer settable parameter, and may be different with the above mentioned set period). Take A-B loop as an example, the operating criterion is:

$$D_{A-G}(x) < k_1 \cdot \min(D_{B-G}(x), D_{C-A}(x)) \quad (3)$$

Normally there will be only 1 loop (either 1 phase-ground loop or 1 phase-to-phase loop) satisfying the above criterion. However, if there are 2 loops (1 phase-ground loop and 1 phase-to-phase loop) satisfying the above criterion at the same time, then only the loop with smaller changing rate will be set as satisfying the criterion.

2) Criteria for Symmetrical Fault During 3-Phase Swing (Sym-3ph Criterion)

During a 3-phase swing, if the changing rates of all 6 loops keep being much smaller than those of given period $T_{Sym-3ph}$ (e.g. 3 cycles, etc.) before for a set period (e.g. 1 cycle, 1.5 cycles, etc. the length of this period may be an internal setting or customer settable parameter, and may be different with the above mentioned set periods), and meantime the changing rates of all the operating loops are close to each other, a symmetrical fault will be decided. The operating criterion for this case can be expressed as:

$$\begin{cases} D_{A-G}(x) < k_2 \cdot D_{A-G}(x - N_{Sym-3ph}) \\ D_{B-G}(x) < k_2 \cdot D_{B-G}(x - N_{Sym-3ph}) \\ D_{C-G}(x) < k_2 \cdot D_{C-G}(x - N_{Sym-3ph}) \\ D_{A-B}(x) < k_2 \cdot D_{A-B}(x - N_{Sym-3ph}) \\ D_{B-C}(x) < k_2 \cdot D_{B-C}(x - N_{Sym-3ph}) \\ D_{C-A}(x) < k_2 \cdot D_{C-A}(x - N_{Sym-3ph}) \\ D_{A-G}(x) \approx D_{B-G}(x) \approx D_{C-G}(x) \approx D_{A-B}(x) \approx D_{B-C}(x) \approx D_{C-A}(x) \end{cases} \quad (4)$$

where $k_2$ may be an internal setting or customer settable parameter, and $N_{Sym-3ph}$ is the number of sample points in the given period $T_{Sym-3ph}$.

3) Criterion for Single Phase Fault/Phase-to-Phase Fault During 2-Phase Swing (Asym-2ph Criterion)

During a 2-phase swing, if the changing rates of one operating loop keep being much smaller than those of the other two operating loops for a set period (e.g. 1 cycle, 1.5 cycles, etc., the length of this period may be an internal setting or customer settable parameter, and may be different with the above mentioned set period), this loop is selected as the fault loop. This criterion is for single-phase-to-ground fault and phase-to-phase fault during the 2-phase swing. Take A-G loop as an example, the operating criterion is:

$$D_{A-G}(x) < k_3 \cdot \min(D_{B-G}(x), D_{A-B}(x)) \quad (5)$$

Where $k_3$ may be an internal setting or customer settable parameter, and the function 'min' is to get the minimum element from its parameters.

4) Criteria for 2-Phase-to-Ground Fault During 2-Phase Swing (Sym-2ph Criterion)

During a 2-phase swing, if the changing rates of all 3 operating loops keep being much smaller than those of given period $T_{Sym-2ph}$ (e.g. 3 cycles, etc.) before for a set period (e.g. 1 cycle, 1.5 cycles, etc. the length of this period may be an internal setting or customer settable parameter, and may be different with the above mentioned set periods), and meantime the changing rates of all the operating loops are close to each other, a 2-phase-to-ground fault will be decided. The operating criterion for can be expressed as:

$$\begin{cases} D_{A-G}(x) < k_4 \cdot D_{A-G}(x - N_{Sym-2ph}) \\ D_{B-G}(x) < k_4 \cdot D_{B-G}(x - N_{Sym-2ph}) \\ D_{A-B}(x) < k_4 \cdot D_{A-B}(x - N_{Sym-2ph}) \\ D_{A-G}(x) \approx D_{B-G}(x) \approx D_{A-B}(x) \end{cases} \quad (6)$$

where $k_4$ may be an internal setting or customer settable parameter, and $N_{Sym-2ph}$ is the number of sample points in the given period $T_{Sym-2ph}$.

Plenty of EMTDC simulations have shown that, preferably, $k_1=k_3=0.3$ and $k_2=k_4=0.1$ can ensure the reliable operation of the algorithm proposed by the present invention.

Next, the fast power swing unblocking method and apparatus for a distance protection in a power system based on the above mentioned principle according to the present invention will be described in detail, which is able to ensure fast phase-segregated tripping of distance protection for faults during a power swing (3-phase or 2-phase swing).

Figure 4:
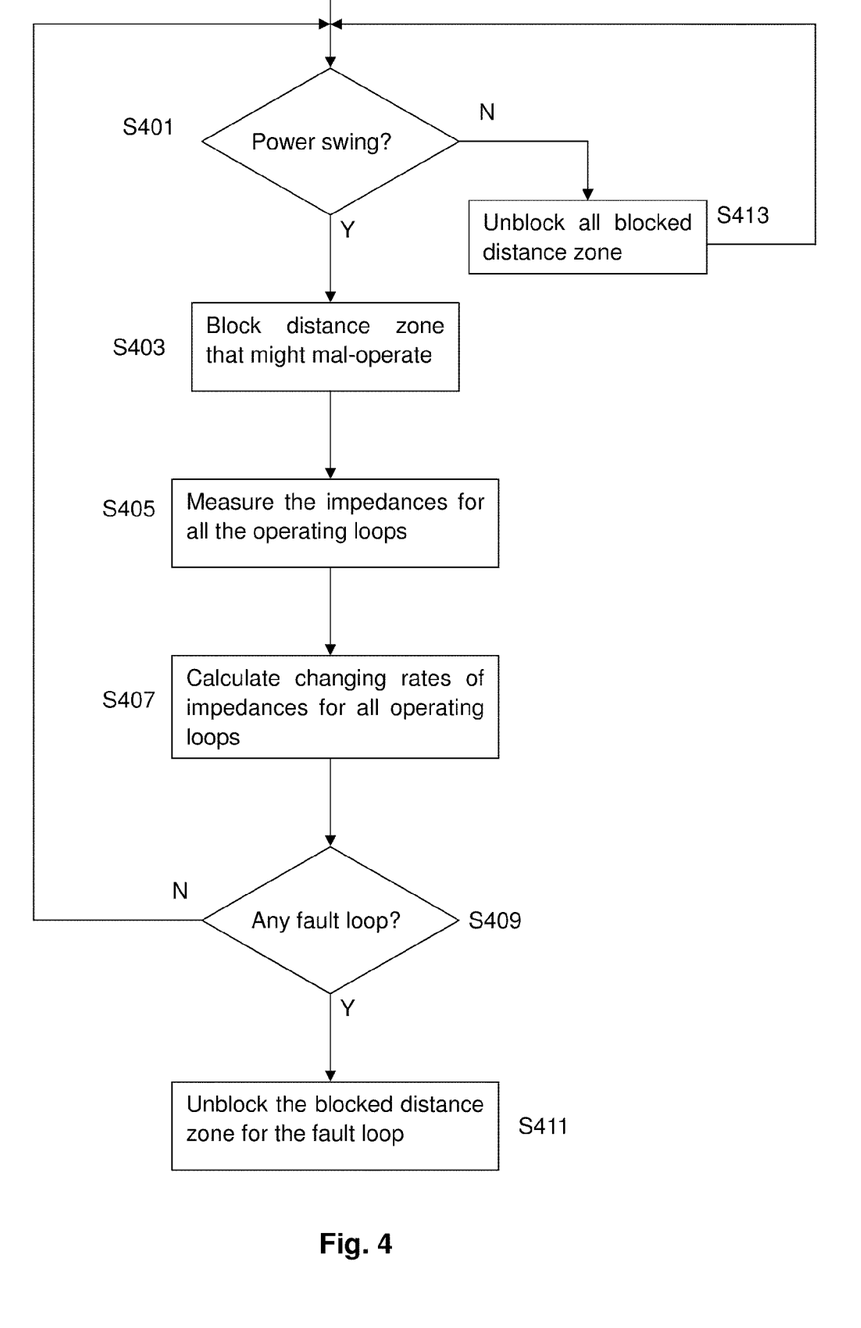
FIG. 4 is a flow chart showing the process of the fast power swing unblocking method for a distance protection in a power system according to one embodiment of the present invention.

FIG. 4 is a flow chart showing the process of the fast power swing unblocking method for a distance protection in a power system according to one embodiment of the present invention.

As shown in FIG. 4, the process of the fast swing unblocking method for a distance protection in a power system according to the present invention starts from step S401, where whether the system is under power swing condition is checked. If it is not under a power swing, then goes to step S413 to unblock all blocked distance zones, and then returns back to the beginning of the execution, i.e. step S401.

If it is checked in step S401 that the power system is under power swing condition, then go to step S403 to block all distance zones that might mal-operate. Then, in step S405, the impedances for all the operating loops in the power system are measured respectively. Thereafter, in step S407, the changing rates of the impedances for all the operating loops in the power system are respectively calculated according to the above-mentioned definition of the changing rates.

Next, in step S409, according to the above-described criterions, it is determined whether there is a fault loop based on the changing rates calculated in step S407. Once a fault loop has been determined, the process is forward to step S411, the blocked distance zone for the fault loop is unblocked. Otherwise, if there is no fault loop, the process returns back to the beginning of the execution, i.e. step S401.

Figure 5:
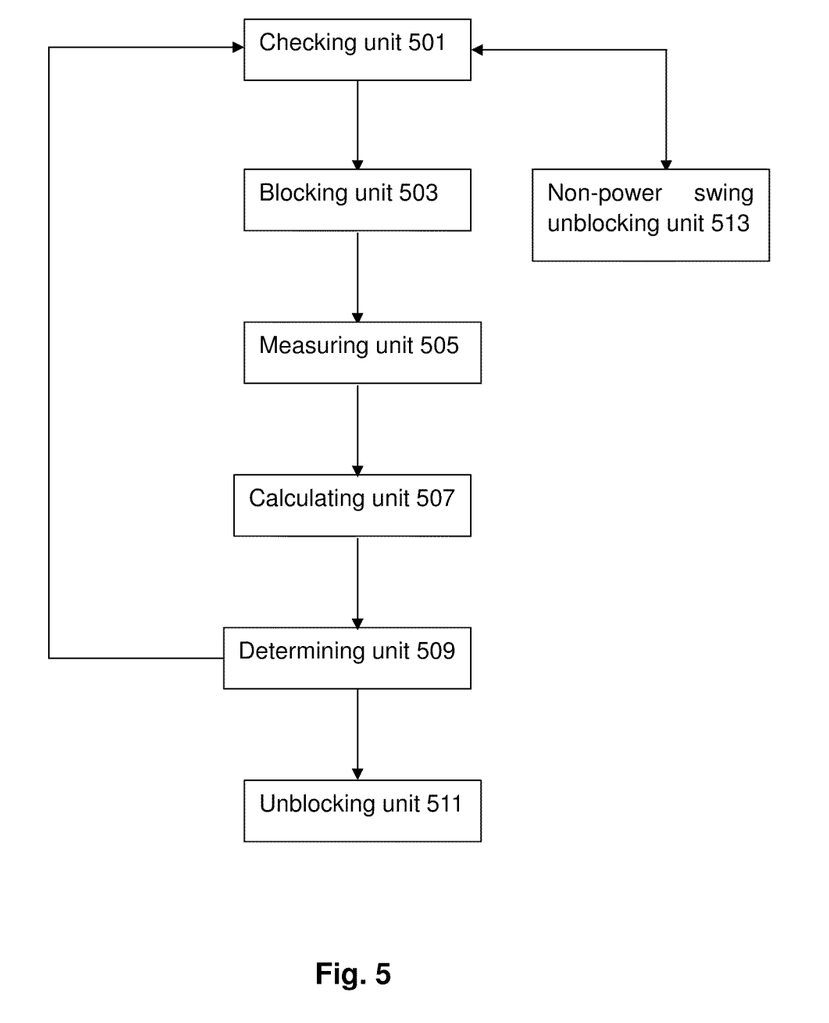
FIG. 5 is a block diagram showing the basic structure of the fast power swing unblocking apparatus for a distance protection in a power system according to one embodiment of the present invention.

FIG. 5 illustrates an exemplary block diagram showing the basic structure of the fast power swing unblocking apparatus for a distance protection in a power system according to one embodiment of the present invention.

As shown in FIG. 5, the fast power swing unblocking apparatus for a distance protection in a power system according to one embodiment of the present invention comprises a checking unit 501, a blocking unit 503, a measuring unit 505, a calculating unit 507, a determining unit 509, an unblocking unit 511 and a non-power swing unblocking unit 513.

The checking unit 501 is configured to check whether the power system is under a power swing. If it is not under a power swing, the checking unit 501 informs the non-power swing unblocking unit 513 to unblock all the blocked distance zones and keeps checking the power swing condition of the power system.

If the checking unit 501 judges that the power system is under a power swing condition, the checking unit 501 informs the blocking unit 503 to block a distance zone that might mal-operate under the power swing.

Under the power swing condition, the measuring unit 505 measures the impedances for all the operating loops in the power system and the calculating unit 507 calculates the changing rates of impedances for all operating loops in the power system according to the above definition of the changing rate in the above formula (1).

After calculating the changing rates of the impedances for all the operating loops, according to the above-described criterions, the determining unit 509 determines whether there is a fault loop based on the changing rates calculated by the calculating unit 507. If there is a fault loop, the unblocking unit 511 unblocks a blocked distance zone for the fault loop. Otherwise, the determining unit 509 informs the checking unit 501 to further checking the power swing condition of the power system.

Figure 6:
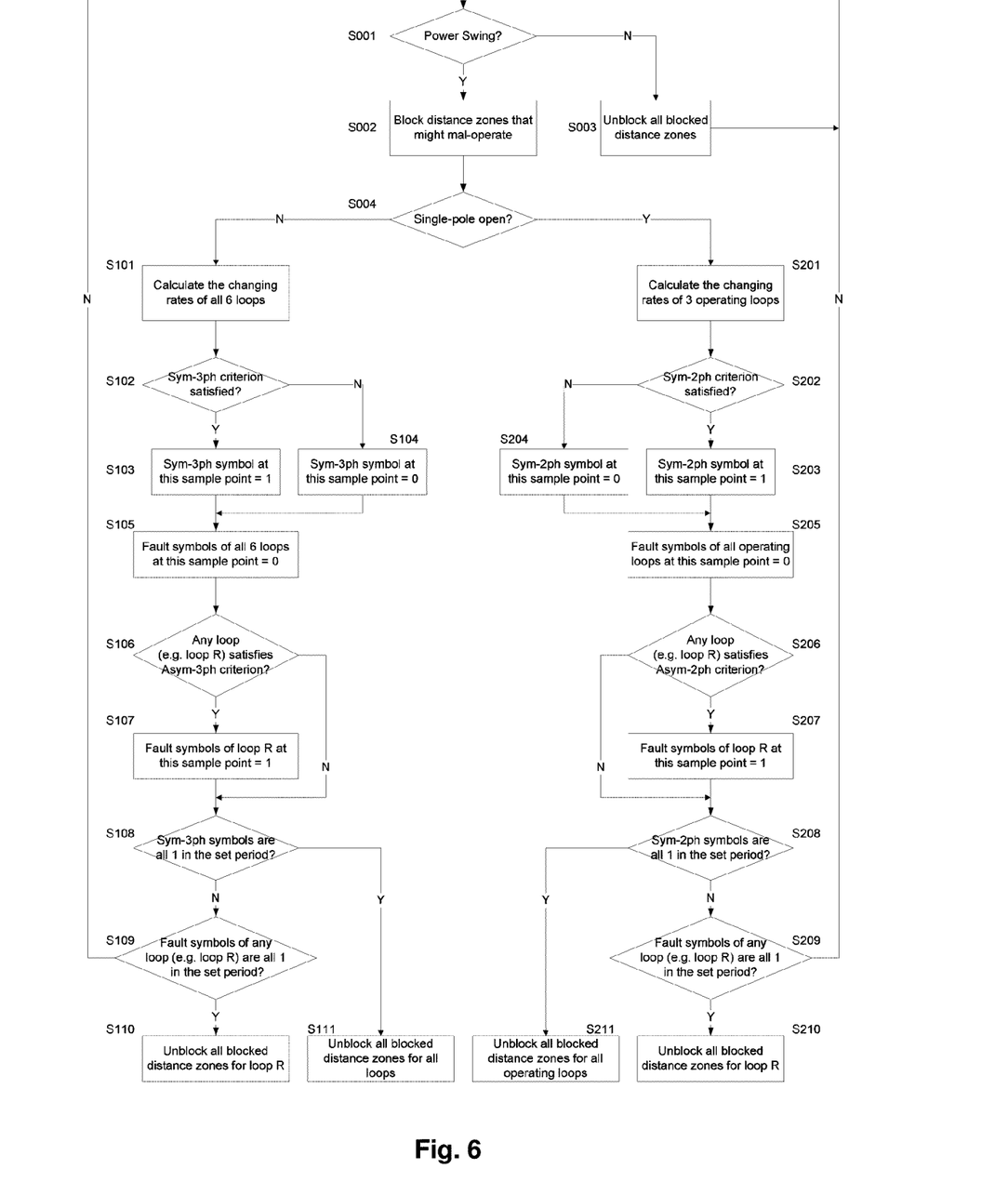
FIG. 6 is a more detailed flow chart showing the process of the fast power swing unblocking method for a distance protection in a power system according to another embodiment of the present invention.

FIG. 6 is a more detailed flow chart showing the process of the fast power swing unblocking method for a distance protection in a power system according to another embodiment of the present invention.

As shown in FIG. 6, the execution of the process for the fast swing unblocking method according to the present invention starts from step S001, to check if the system is under power swing condition. If it is not, then go to step S003 to unblock all blocked distance zones, and then go back to the beginning of the execution.

If the system is under power swing condition, then go to step S002 to block all distance zones that might mal-operate. Then in step S004, find out whether the system is under single-pole open condition. If the system is not under single-pole open condition, then go to S101 to calculate the changing rate of all 6 loops (loop A-G, B-G, C-G, A-B, B-C and C-A) according to the above-mentioned formula (1) and then go further to step S102. If the system is under single-pole open condition, then go to S201 to calculate the changing rate of the remaining 3 operating loops (for example, if phase C is opened, loop A-G, B-G, and A-B) according to the above-mentioned formula (1) and then go further to step S202.

After step S101, go to step S102 to check if the Sym-3ph criterion is satisfied. If the result is 'Yes', then go to step S103 to set the Sym-3ph symbol of this sample point to 1, then go to step S105; otherwise, go to step S104 to set the Sym-3ph symbol of this sample point to 0, and then go to step S105. In step S105, set the fault symbols of all 6 loops at this sample point to 0. Then in step S106, check all 6 loops to find out if there is any loop that satisfies the asym-3ph criterion. If loop R satisfies the asym-3ph criterion (loop R can be any one in loop A-G, B-G, C-G, A-B, B-C and C-A), then go to step S107 and set the fault symbols of this loop R at this sample point to 1, and then go to step S108. If there is no loop that satisfies the asym-3ph criterion, then go to step S108 directly. In step S108, check if the sym-3ph symbols have been 1 for the set period (e.g., 1 cycle). If the result is 'Yes', then a symmetrical fault will be decided, and all the blocked distance zones for all loops will be unblocked in step S111. If the result of step S108 is 'No', then go to step S109 to check if there is any loop whose fault symbols have been 1 for the set period (e.g., 1 cycle). If the result is 'Yes', then an asymmetrical fault will be decided, and all the blocked distance zones for the selected fault loop will be unblocked in step S110. If the result of step S109 is 'No', then go back to the beginning of the execution.

For the single-pole open power swing (2-phase swing) condition, the process is similar as the above process for 3-phase power swing condition. After step S201, go to step S202 to check if the Sym-2ph criterion (for 2-phase-to-ground fault) is satisfied. If the result is 'Yes', then go to step S203 to set the Sym-2ph symbol of this sample point to 1, then go to step S205; otherwise, go to step S204 to set the Sym-2ph symbol of this sample point to 0, and then go to step S205. In step S205, set the fault symbols of the 3 operating loops at this sample point to 0. Then in step S206, check all these 3 operating loops to find out if there is any loop that satisfies the asym-2ph criterion. If loop R satisfies the asym-2ph criterion (loop R can be any one in the operating loops. For example, if phase C is opened, loop A-G, B-G, and A-B), then go to step S207 and set the fault symbols of this loop R at this sample point to 1, and then go to step S208. If there is no loop that satisfies the asym-2ph criterion, then go to step S208 directly. In step S208, check if the sym-2ph symbols have been 1 for the set period (e.g., 1 cycle). If the result is 'Yes', then a 2-phase-to-ground fault will be decided, and all the blocked distance zones for all 3 operating loops will be unblocked in step S211. If the result of step S208 is 'No', then go to step S209 to check if there is any loop whose fault symbols have been 1 for the set period (e.g., 1 cycle). If the result is 'Yes', then a single-phase fault or phase-to-phase fault will be decided, and all the blocked distance zones for the selected fault loop will be unblocked in step S210. If the result of step S209 is 'No', then go back to the beginning of the execution of the process.

From the above description it can be seen that the presented invention can detect a fault and select the fault loop during a power swing. It can operate in less than 120 ms after the fault inception, and for most metallic fault cases, around 60 ms.

Furthermore, the present invention is suitable for both 3-phase swing and 2-phase swing and the present invention is immune to power swing period (for example, 0.1~5 s) and power angle when fault occurs.

By applying this invention, the performance of the distance protection during power swings can be improved. The distance protection can ensure faster and phase-segregated operation, which are very beneficial for the system reliability.

In addition, it should be noted that, the above series of processes and apparatus may also be implemented by software and/or firmware. In case of implementing them by software and/or firmware, a program constituting the software may be installed into a computer with dedicated hardware, for example, a general-purpose personal computer 700 as shown in FIG. 7 from a storage medium or a network, and the computer is capable of performing various functions if with various programs installed therein.

Figure 7:
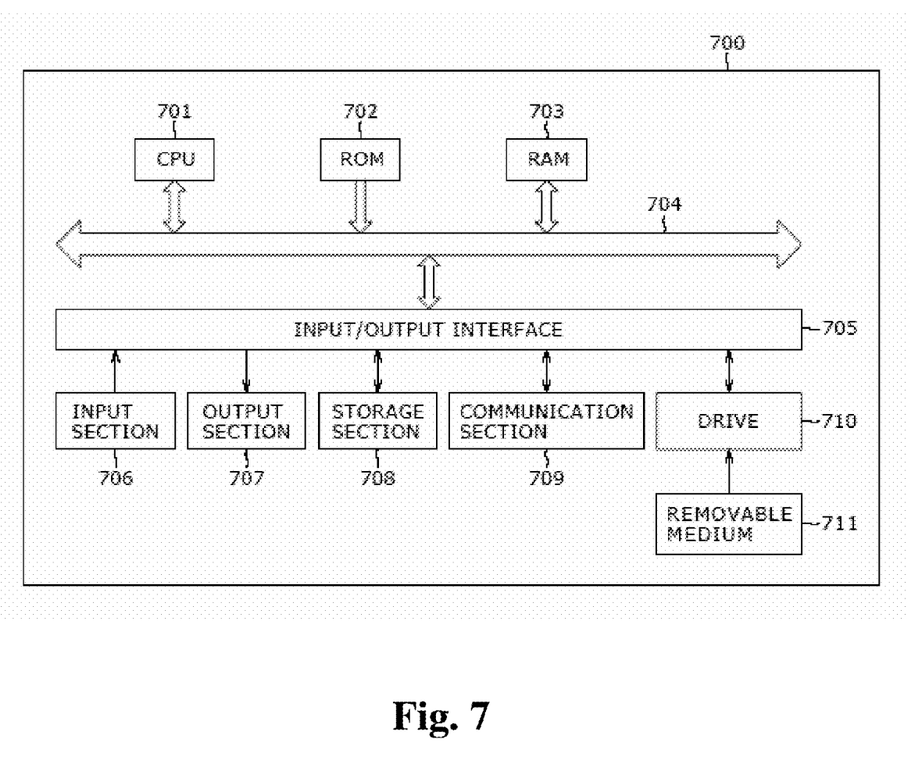
FIG. 7 is a block diagram illustrating an exemplary structure of a personal computer.

In FIG. 7, a Central Processing Unit (CPU) 701 performs various processes based on a program stored in a Read Only Memory (ROM) 702 or a program loaded from a storage section 708 to a Random Access Memory (RAM) 703. In the RAM 703, data necessary when the CPU 701 performs the various processes or the like is also stored as necessary.

The CPU 701, the ROM 702, and the RAM 703 are connected to one another via a bus 704. An input/output interface 705 is also connected to the bus 704.

To the input/output interface 705 are connected: an input section 706 including a keyboard, a mouse, or the like; an output section 707 including a display such as a Cathode Ray Tube (CRT), a Liquid Crystal Display (LCD), or the like, and a loudspeaker or the like; the storage section 708 including a hard disk or the like; and a communication section 709 including a network interface card such as a LAN card, a modem, or the like. The communication section 709 performs a communication process via the network such as the Internet.

A drive 710 is also connected to the input/output interface 705 as necessary. A removable medium 711, such as a magnetic disk, an optical disk, a magneto-optical disk, a semiconductor memory, or the like, is loaded on the drive 710 as necessary, so that a computer program read there from may be installed into the storage section 708 as necessary.

In the case where the above-described series of processes is implemented with software, the program that constitutes the software may be installed from a network such as the Internet or a storage medium such as the removable medium 711.

Those skilled in the art would appreciate that, the storage medium is not limited to the removable medium 711 having the program stored therein as illustrated in FIG. 17, which is delivered separately from the device for providing the program to the user. Examples of the removable medium 711 include a magnetic disk (including a floppy disk (registered trademark)), an optical disk (including a Compact Disk-Read Only Memory (CD-ROM) and a Digital Versatile Disk (DVD)), a magneto-optical disk (including a Mini-Disk (MD) (registered trademark)), and a semiconductor memory. Alternatively, the storage medium may be the ROM 702, the hard disk contained in the storage section 708, or the like, which has the program stores therein and is delivered to the user together with the device that contains them.

Furthermore, it is noted herein that, in order to avoid obscuring the present invention due to unnecessary details, the drawings only show device structures and/or processing steps closely related to the solutions according to the present invention and other details little related to the present invention are omitted.

Finally, it is also noted that, in this disclosure, relational terms such as left and right, first and second, and the like are used merely to distinguish one entity or action from another entity or action without necessarily requiring or implying any actual such relationship or order between such entities or actions. Moreover, the terms "comprise", "comprising," "include" or any other variations thereof, are intended to cover a non-exclusive inclusion so that a process, method, article, or device that comprises a list of elements does not only include these elements but also may include other elements not explicitly listed or inherent to such process, method, article, or device. An element preceded by "a" or "an" does not, without more constraints, preclude the existence of additional identical elements in the process, method, article, or device that comprises the element.

Although the embodiments of the present invention have been described in detail with reference to the accompanying drawings, it should be noted that, these embodiments are only used to illustrate the present invention but not to limit the present invention. Various modifications, combinations, sub-combinations and alterations can be made by those skilled in the art depending on design and other factors insofar as they are within the scope of the appended claims or the equivalents thereof. Therefore, the scope of the present invention is only defined by the appended claims and the equivalents thereof.

What is claimed is:

1. A power swing unblocking method in a power system comprising:
    checking whether the power system is under a power swing;
    blocking a distance zone that might mal-operate under the power swing in response to determining the checked power system is under the power swing
    measuring impedances for all operating loops in the power system;
    calculating changing rates of the impedances for all of the operating loops in the power system;

determining one or more fault loops based on the calculated changing rates;
and
unblocking a blocked distance zone for a fault loop;
wherein during a 3-phase power swing, in the step of determining the fault loop based on the calculated changing rates, if the changing rates of all the operating loops continue being smaller than those of a predetermined period before a set period respectively and the changing rates of all the operating loops are close to each other, a symmetrical fault is determined.

2. The method according to claim 1, further comprising:
unblocking the blocked distance zone for the fault loop within 120 ms of said fault.

3. The method according to claim 1, wherein,
the changing rates of the impedances for all the operating loops in the power system are respectively calculated according to the following formula:

$$D_y(x)=abs(Z_y(x)-Z_y(x-p))$$

where D is the changing rate, subscript "y" represents the operating loop under measurement, Z is a measured impedance, x is a current measured sample point and p represents a number of sample points during an intervening period.

4. The method according to claim 1, wherein during a 3-phase power swing, in the step of determining the fault loop based on the calculated changing rates, if the changing rate of one phase-ground loop continues being smaller than those of the other two phase-ground loops for a set period, the one phase-ground loop is determined as the fault loop.

5. The method according to claim 1, wherein during a 3-phase power swing, in the step of determining the fault loop based on the calculated changing rates, if the changing rate of one phase-to-phase loop continues being smaller than those of the other two phase-to-phase loops for a set period, the one phase-to-phase loop is determined as the fault loop.

6. The method according to claim 1, wherein during a 2-phase power swing, in the step of determining the fault loop based on the calculated changing rates, if the changing rates of all the 3 operating loops continue being smaller than those of predetermined period before for a set period respectively and the changing rates of all the operating loops are close to each other, a 2-phase-to-ground fault is determined.

7. The method according to claim 1, wherein during a 2-phase power swing, in the step of determining the fault loop based on the calculated changing rates, if the changing rate of one operating loop continues being smaller than those of the other two operating loops for a set period, the one operating loop is determined as the fault loop.

8. The method according to claim 1, wherein in the step of determining the fault loop based on the calculated changing rates, the operating loop with a smallest changing rate is determined as the fault loop.

9. A power swing unblocking apparatus in a power system comprising:
a checking means configured to check whether the power system is under a power swing;
a blocking means configured to block one or more distance zones that might mal-operate under the power swing in response to the power system under the power swing,
a measuring means configured to measure impedances for all operating loops in the power system;
a central processing unit configured to calculate changing rates of the impedances for all of the operating loops in the power system;
a determining means configured to determine one or more fault loops based on the changing rates calculated by the calculating means;
and
unblocking means configured to unblock a blocked distance zone for the fault loop;
wherein the determining means is further configured to during a 3-phase power swing, if the changing rates of all the operating loops continue being smaller than those of a predetermined period before a set period respectively and the changing rates of all the operating loops are close to each other, a symmetrical fault is determined.

10. The apparatus according to claim 9, wherein the unblocking means unblocks the blocked distance zone for the fault loop within 120 ms of said fault.

11. The apparatus according to claim 9, wherein
the changing rates of the impedances for all the operating loops in the power system are respectively calculated by the calculating means according to the following formula:

$$D_y(x)=abs(Z_y(x)-Z_y(x-p))$$

where D is the changing rate, a subscript "y" represents the operating loop under measurement, Z is a measured impedance, x is a current measured sample point and p represents a number of sample points during an intervening period.

12. A computer readable storage medium encoded with computer readable instructions, which, when executed by a processor, cause the processor to:
check whether the power system is under a power swing;
block a distance zone that might mal-operate under the power swing in response to determining the checked power system is under the power swing;
measure impedances for all operating loops in the power system;
calculate changing rates of impedances for all of the operating loops in a power system;
determine one or more fault loops based on the calculated changing rates;
and
unblock a blocked distance zone for a fault loop;
wherein during a 3-phase power swing, in the step of determining the fault loop based on the calculated changing rates, if the changing rates of all the operating loops continue being smaller than those of a predetermined period before a set period respectively and the changing rates of all the operating loops are close to each other, a symmetrical fault is determined.

13. The computer readable storage medium of claim 12, the computer readable instructions, when executed by the processor, further cause the processor to unblock the blocked distance zone for the fault loop in less than 120 ms after said fault.

14. The computer readable storage medium of claim 12, wherein the changing rates of the impedances for all the operating loops in the power system are respectively calculated according to the following formula:

$$D_y(x)=abs(Z_y(x)-Z_y(x-p))$$

where D is the changing rate, subscript "y" represents the operating loop under measurement, Z is a measured impedance, x is a current measured sample point and p represents a number of sample points during an intervening period.

15. The computer readable storage medium of claim 12, wherein during a 3-phase power swing, when determining the fault loop based on the calculated changing rates, at least one of:

if the changing rates of all the operating loops continue being smaller than those of a predetermined period before for a set period respectively and the changing rates of all the operating loops are close to each other, a symmetrical fault is determined;

if the changing rate of one phase-ground loop continues being smaller than those of the other two phase-ground loops for a set period, the one phase-ground loop is determined as the fault loop; or     if the changing rate of one phase-to-phase loop continues being smaller than those of the other two phase-to-phase loops for a set period, the one phase-to-phase loop is determined as the fault loop.

16. The computer readable storage medium of claim 12, wherein during a 2-phase power swing, when determining the fault loop based on the calculated changing rates, at least one of:

if the changing rates of all the three operating loops continues being smaller than those of a predetermined period before for a set period respectively and the changing rates of all the operating loops are close to each other, a 2-phase-to-ground fault is determined; or     in the step of determining the fault loop based on the calculated changing rates, if the changing rate of one operating loop continues being smaller than those of the other two operating loops for a set period, the one operating loop is determined as the fault loop.

\* \* \* \* \*